US006426516B1

(12) United States Patent
Sloman

(10) Patent No.: US 6,426,516 B1
(45) Date of Patent: Jul. 30, 2002

(54) KERF CONTACT TO SILICON REDESIGN FOR DEFECT ISOLATION AND ANALYSIS

(75) Inventor: David E. Sloman, Poughkeepsie, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/375,138

(22) Filed: Aug. 16, 1999

(51) Int. Cl.$^7$ ............................................. H01L 23/58
(52) U.S. Cl. ............................ 257/48; 324/765; 438/18
(58) Field of Search ............................. 257/48; 438/18; 324/765

(56) References Cited

U.S. PATENT DOCUMENTS 4,918,377 A * 4/1990 Buehler et al. ............. 324/691
5,051,690 A * 9/1991 Maly et al. .................... 438/18
5,239,191 A * 8/1993 Sakumoto et al. ........... 257/203
5,637,186 A   6/1997 Liu et al.
5,831,446 A  11/1998 So et al.
5,923,047 A * 7/1999 Chia et al. .................... 257/48

FOREIGN PATENT DOCUMENTS

JP          06-088852 A  *  3/1994  .................. 324/765

OTHER PUBLICATIONS

Shultis, D.E., "Semiconductor Wafer Testing", Dec. 1970, IBM Technical Disclosure Bulletin, vol. 13, No. 7, p. 1793.*

* cited by examiner

Primary Examiner—Howard Weiss
(74) Attorney, Agent, or Firm—McGinn & Gibb, PLLC; Howard J. Walter, Jr. Esq.

(57) ABSTRACT

A method and structure for an integrated circuit technology segment test structure including a plurality of technology test structures connected together as a chain of elements and a plurality of externally probable regions positioned along said chain of elements, said externally probable regions being positioned so as to enable location of a failed test structure.

20 Claims, 4 Drawing Sheets

KERF CONTACT TO SILICON REDESIGN FOR DEFECT ISOLATION AND ANALYSIS

BACKGROUND OF THE INVENTION

1. Field of the Invention

The present invention generally relates to testing conductive patterns in integrated circuits and more particularly to an improved system for identifying the location of defects in conductive patterns.

2. Description of the Related Art

State of the art integrated circuits, such as semiconductor chips, include multiple levels of patterned wiring (e.g., levels M1–M4). During manufacturing, the patterned conductors are tested for defects. In one form of testing, contact chains (which connect thousands of contacts/conductors on a give area of a chip) are formed and tested for electrical conductivity. One such contact chain is referred to as a "kerf" contact chain. The kerf is the area which will be removed during the separation of chips on a wafer. The chains are formed by contacts in these "kerf" areas and the chains are broken when the chips are separated and the kerf region is removed.

FIGS. 1A and 1B illustrate conventional serpentine contact chains. More specifically, FIGS. 1A and 1B illustrate one metalization level (e.g., M1) of a semiconductor integrated circuit. As shown most clearly in the enlarged view in FIG. 1B, contacts 10 connect each of the rows of metal wiring with succeeding and preceding rows such that, as shown most clearly in FIG. 1A, all the wiring forms one large conductive circuit (only a portion of which is shown in FIG. 1A). FIG. 1C illustrates a cross-section of a polysilicon level 102 within an integrated circuit chip, a first metalization level 100, a second metalization level 101 and conductive studs 103 connecting the different levels.

If any one element in a contact chain is defective, the entire chain will fail electrical testing. However, there is no conventional mechanism for isolating which contact/row in the contact chain failed without a destructive test.

For years the failure analysis community has been unable to provide timely and accurate assessments of quality and reliability in contact chains. Trying to isolate a problem and determine if that problem is with one contact, many random contacts, or all contacts is extremely time consuming and impractical. Time wasted in analysis increases costs and decreases yield. Thus, faster turnaround time is greatly needed.

There is also a problem of accuracy in the conventional destructive analysis. More specifically, the conventional systems make contact to a very thin line 10 in order to take a measurement. Such contact often damages the line 10. The resulting damage adds error to any measurement, and therefore affects the analysis adversely. Therefore, there is a need for an improved system and method which can quickly determine which contact in a chain is defective without damaging any contact in the chain.

SUMMARY OF THE INVENTION

It is, therefore, an object of the present invention to provide a structure and method for an integrated circuit technology segment test structure that includes a plurality of technology test structures connected together as a chain of elements and a plurality of externally probable regions positioned along the chain of elements. The externally probable regions are positioned so as to enable location of a failed test structure. The externally probable regions include probe pads connected to the chain of elements. The chain of elements includes a plurality of rows and contacts connecting each row to an adjacent row, such that the contacts form a serpentine chain with the rows. The externally probable regions are connected to and are larger than the contacts, and they permit individual testing of each of the rows. The technology test structures are a wiring level in an integrated circuit.

Another embodiment of the invention is an integrated circuit chip that includes a plurality of devices connected together as a test chain and a plurality of probe pads positioned along the test chain. The probe pads are positioned so as to locate of a defective device in the test chain. The test chain includes a plurality of rows of the devices and the contacts connect each row to an adjacent row, such that the contacts form a serpentine test chain with the rows. The probe pads are connected to and are larger than the contacts, and they permit individual testing of each of the rows. The devices are a wiring level in an integrated circuit.

Yet another embodiment of the invention is a wafer having plurality of integrated circuit chips, each of the chips includes a plurality of devices connected together as a test chain, and a plurality of probe pads positioned along the test chain. The probe pads are positioned so as to locate of a defective device in the test chain. The test chain comprises a plurality of rows of the devices. The contacts connect each row to an adjacent row, such that the contacts form a serpentine test chain with the rows. The probe pads are connected to and are larger than the contacts, and they permit individual testing of each of the rows. The devices are a wiring level in an integrated circuit. The probe pads are positioned between the integrated circuit chips, such that the probe pads are removed when the integrated circuit chips are separated.

Therefore, with the invention, the location of the defect in a defective chain can be precisely determined without damaging any element of the chain.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Contact chains provide process and reliability engineers with information about the basic connections between conductors within an integrated circuit device, upper levels of wiring as well as wiring outside the integrated circuit package. If any single contact should be electrically open or excessively resistive, the entire chain will fail.

Figure 2A:
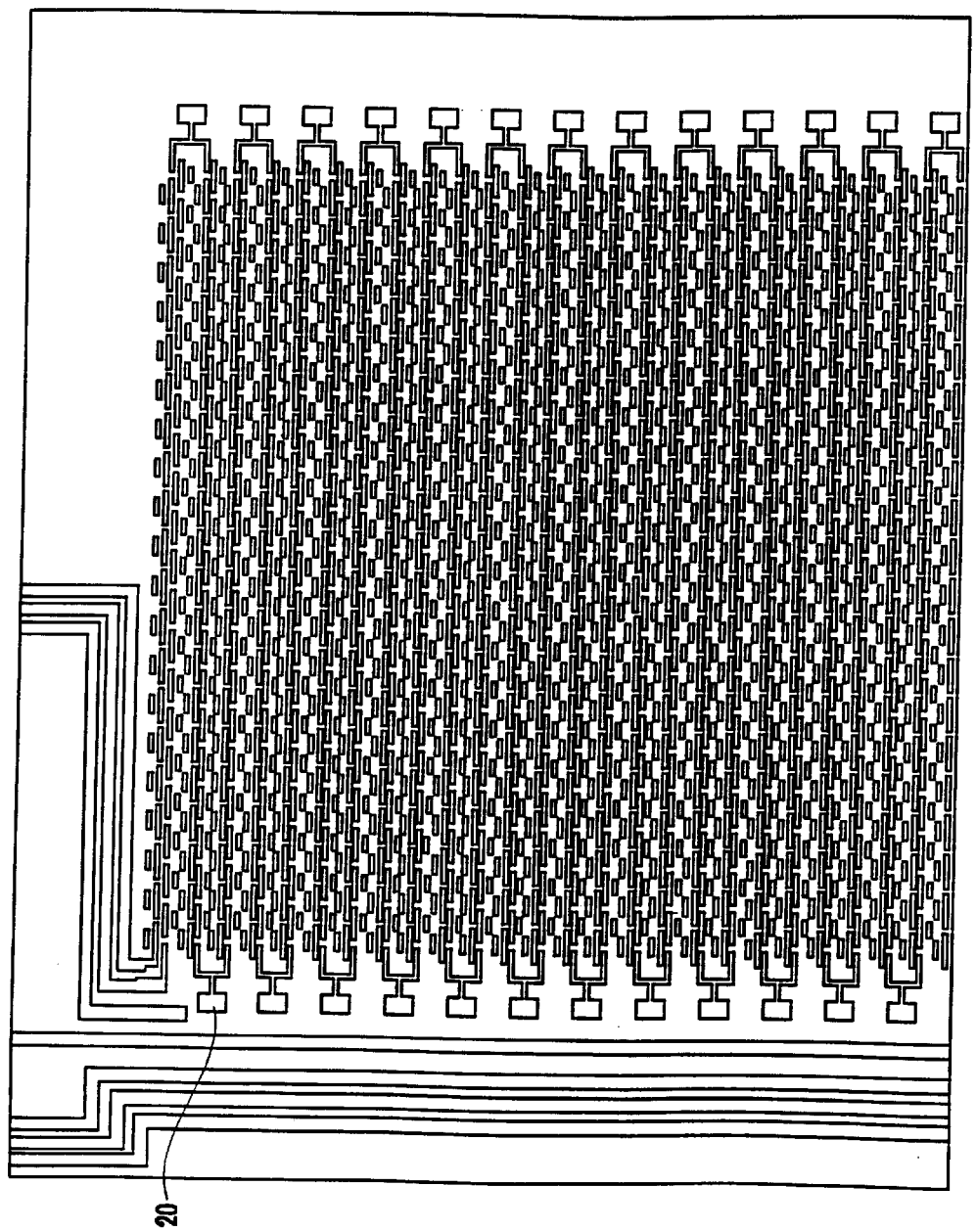
FIG. 2A is a schematic diagram of a top view of a contact chain having probe pads.
Figure 2B:
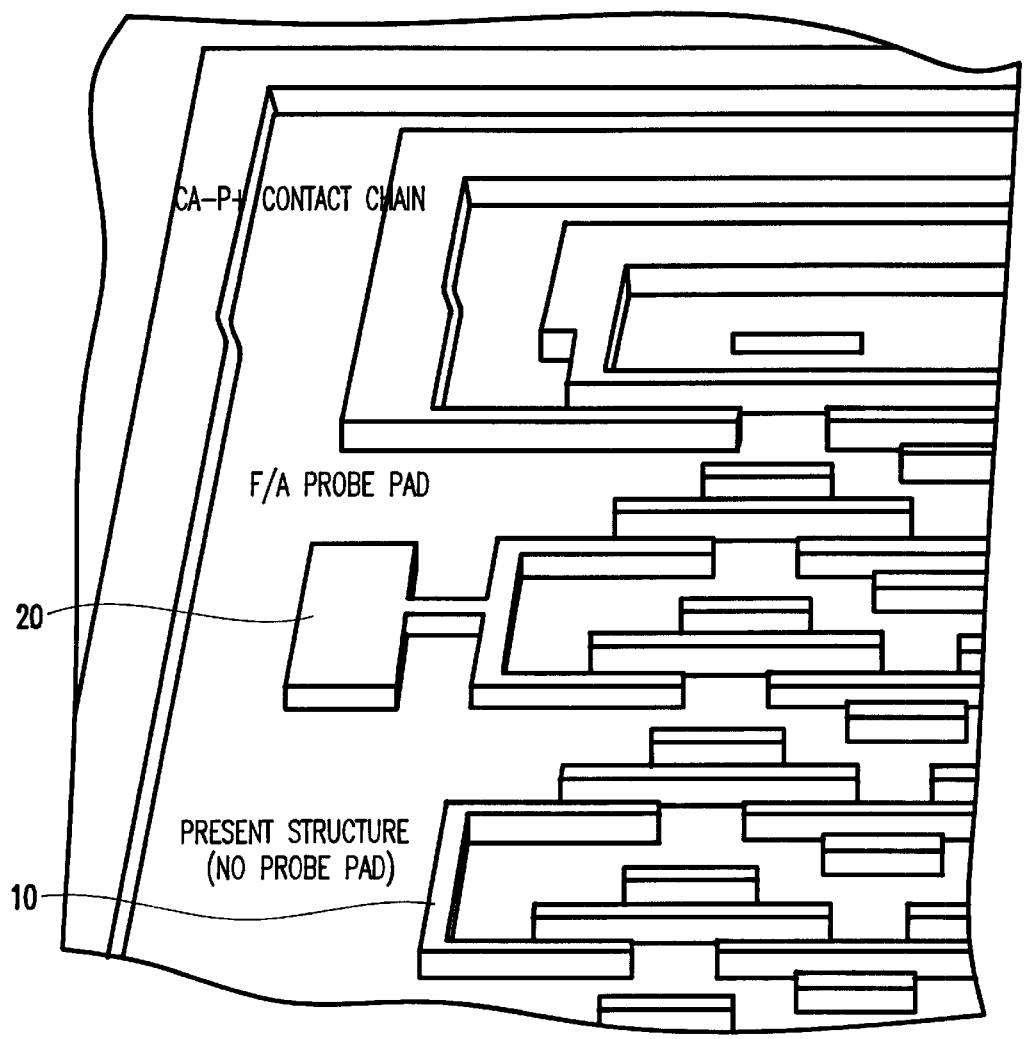
FIG. 2B is an enlarged schematic diagram of top view of a portion of the contact chain in FIG. 2A.

To overcome the problems with conventional chains discussed above, the invention includes redesigned contacts chains that include conductive pads 20 (FIGS. 2A–2B)

connected to the ends of each row in the contact chain in the kerf region of the wafer (e.g., the portion that will be removed when the wafer is separated into individual chips). The pads 20 allow any row of contacts within the chain to be individually tested in order to isolate electrically open or excessively resistive contacts, without contacting the chain itself, or damaging any of the chain's connecting metal.

Figure 1A:
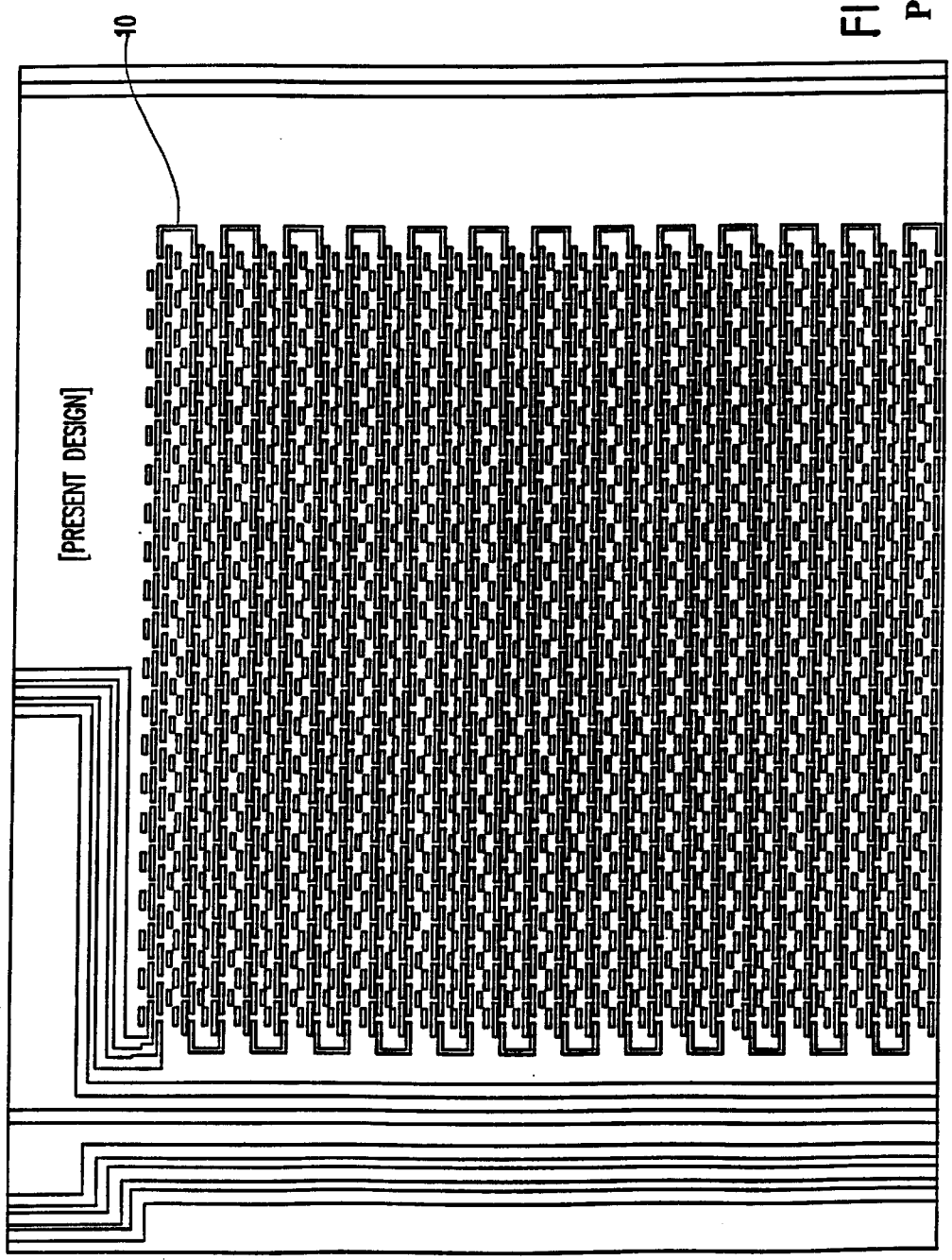
FIG. 1A is a schematic diagram of a top view of a contact chain.
Figure 1B:
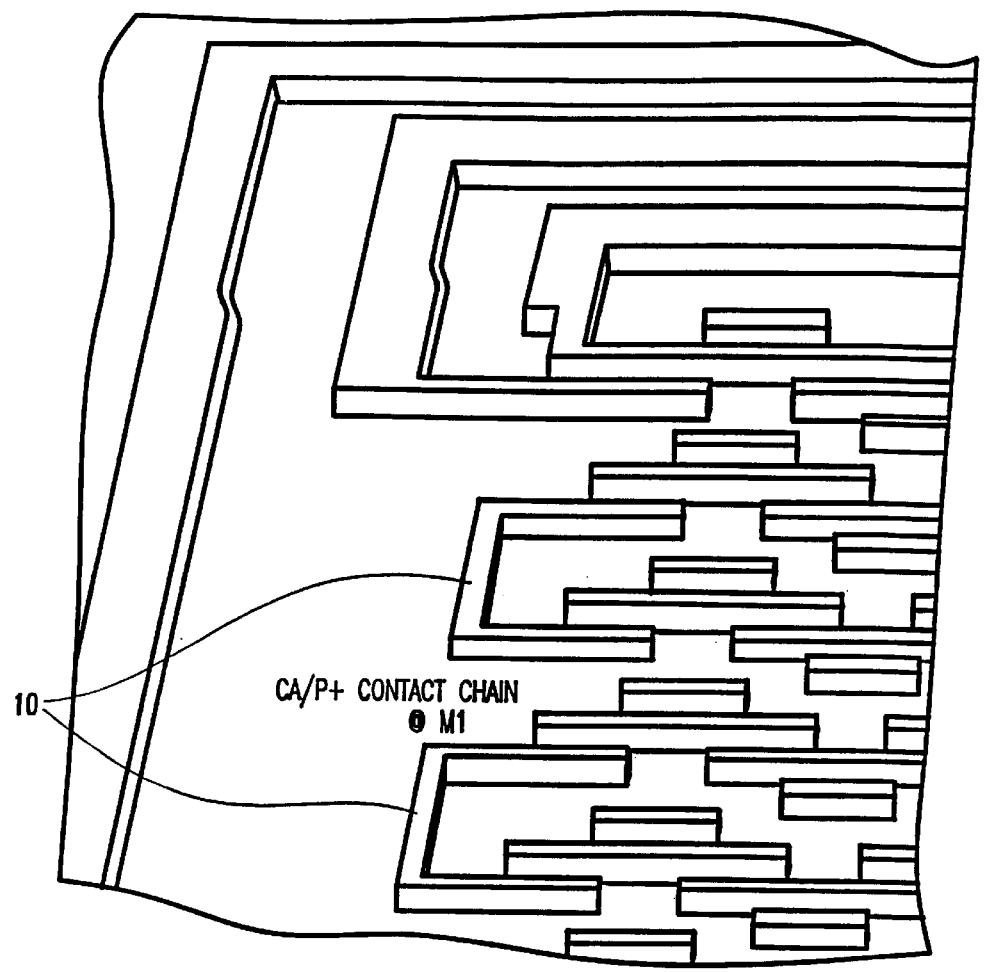
FIG. 1B is an enlarged schematic diagram of a top view of a portion of the contact chain in FIG. 1A.
Figure 1C:
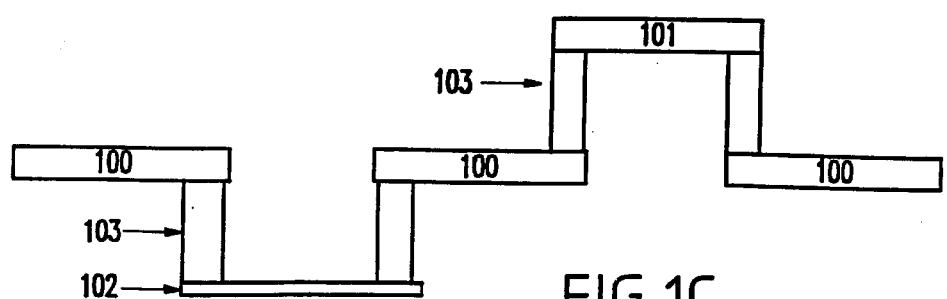
FIG. 1C is a schematic diagram of a cross-sectional view of a contact chain.

FIG. 2A is similar to FIG. 1A and illustrates many rows connected into a serpentine chain. However, FIG. 2A illustrates probe pads 20 which allow each row to be individually (and non-destructively) tested. One probe pad 20 is illustrated in greater detail in the expanded diagram in FIG. 2B. Note that FIG. 2B illustrates only one probe pad 20 and one conventional chain contact 10 to highlight the differences between invention and conventional structures. However, in a preferred embodiment, all contacts 10 would include the inventive probe pads 20, as shown in FIG. 2A. As would be known by one ordinarily skilled in the art given this disclosure, the probe pads 20 could be positioned at every other contact 10, every third contact 10, every fourth contact 10, etc.

The probe pads 20 allow repeated measurements to be taken. Further, the pads 20 are separate from the contacts 10. Therefore, even if the testing probe which contacts the probe pad 20 damages the probe pad 20, the remaining contact 10 and associated row will not be damaged by the testing. Thus, the metal pads 20 allow the failure analysis engineer to isolate the electrical fault (resistance, open, short).

Additionally, the probe pads 20 are substantially larger than the contacts 10 (e.g., 5–20 times larger) which increases the likelihood of a good contact between the testing probe and the probe pad and decreases the likelihood that the testing probe will damage the probe pad.

Therefore, if a chain is found to be defective, the individual contact pads can be probed to locate the defect. For example, in a preferred embodiment, when a chain is found to be defective one end of the contact chain would be connected to a first test probe and a contact pad in the middle of the chain would be connected to the other test probe to test one-half of the chain. The other half of the chain would then be similarly tested. The half of the chain which is determined to include the defect is then similarly divided it into two quarters. The process continues by dividing the quarter having the defect in half and so on until the defective row(s) is located.

While the invention has been discussed above with respect to a first metalization level in a semiconductor device, it is equally applicable to any conductive level (e.g., polysilicon, alloy, etc.) in any similar type of integrated circuit device.

While the invention has been described in terms of preferred embodiments, those skilled in the art will recognize that the invention can be practiced with modification within the spirit and scope of the appended claims.

What is claimed is:

1. An integrated circuit technology segment test structure comprising:
   a plurality of technology test structures connected together as a chain of elements, said chain of elements having at least one turn; and
   a probable region positioned at each said turn of said chain of elements, said probable region being positioned so as to enable location of a failed test structure.

2. The structure in claim 1, wherein said probable region comprises a probe pad connected to said chain of elements.

3. The structure in claim 1, wherein said chain of elements comprises:
   a plurality of rows; and
   contacts connecting each row to an adjacent row, such that said contacts form a serpentine chain with said rows.

4. The structure in claim 3, wherein said probable region is connected to each of said contacts.

5. The structure in claim 4, wherein said probable region is larger than said contacts.

6. The structure of claim 3, wherein said probable region permits individual testing of each of said rows.

7. The structure in claim 1, wherein said technology test structures comprise a wiring level in an integrated circuit.

8. An integrated circuit chip comprising:
   a plurality of devices connected together as a test chain, said test chain having at least one turn; and
   a probe pad positioned at each said turn of said test chain, said probe pad being positioned so as to locate a defective device in said test chain.

9. The integrated circuit chip in claim 8, wherein said test chain comprises:
   a plurality of rows of said devices; and
   contacts connecting each row to an adjacent row, such that said contacts form a serpentine test chain with said rows.

10. The integrated circuit chip in claim 9, wherein said probe pad is connected to each of said contacts.

11. The integrated circuit chip in claim 10, wherein said probe pad is larger that said contacts.

12. The integrated circuit chip in claim 9, wherein said probe pad permits individual testing of each of said rows.

13. The integrated circuit chip in claim 8, wherein said devices comprise a wiring level in an integrated circuit.

14. An integrated circuit wafer comprising:
   a plurality of integrated circuit chips, each of said chips including:
   a plurality of devices connected together as a test chain, said test chain having at least one turn; and
   a probe pad positioned at each said turn of said test chain, said probe pad being positioned so as to locate of a defective device in said test chain.

15. The integrated circuit wafer in claim 14, wherein said test chain comprises:
   a plurality of rows of said devices; and
   contacts connecting each row to an adjacent row, such that said contacts form a serpentine test chain with said rows.

16. The integrated circuit wafer in claim 15, wherein said probe pad is connected to said contacts.

17. The integrated circuit wafer in claim 16, wherein said probe pad is larger that said contacts.

18. The integrated circuit wafer in claim 15, wherein said probe pad permits individual testing of each of said rows.

19. The integrated circuit wafer in claim 14, wherein said devices comprise a wiring level in an integrated circuit.

20. The integrated circuit wafer in claim 14, wherein said probe pad is positioned between said integrated circuit chips, such that said probe pad is removed when said integrated circuit chips are separated.

* * * * *